United States Patent [19]
Shiraiwa et al.

[11] Patent Number: 5,132,252
[45] Date of Patent: Jul. 21, 1992

[54] METHOD FOR FABRICATING SEMICONDUCTOR DEVICES THAT PREVENTS PATTERN CONTAMINATION

[75] Inventors: Hidehiko Shiraiwa, Gresham, Oreg.; Hisatsugu Shirai; Nobuhiro Takahashi, both of Kawasaki, Japan; Shinichi Nomura, Higashimorokata, Japan

[73] Assignees: Fujitsu Limited, Kawasaki; Kyushu Fujitsu Electronics Limited, Kagoshima, both of Japan

[21] Appl. No.: 343,456

[22] Filed: Apr. 25, 1989

[30] Foreign Application Priority Data

Apr. 28, 1988 [JP] Japan ................ 63-105737

[51] Int. Cl.⁵ ............ H01L 21/00; H01L 21/02; H01L 21/78; H01L 21/316
[52] U.S. Cl. ............... 437/227; 437/225; 437/226; 148/DIG. 28
[58] Field of Search ........... 437/225, 226, 227, 228, 437/235, 238, 240; 148/Dig.28

[56] References Cited

U.S. PATENT DOCUMENTS 4,179,794 12/1979 Kosugi et al. ............ 437/67
4,306,351 12/1981 Ohsaka et al. ............ 437/205

FOREIGN PATENT DOCUMENTS 2282162  3/1976  France .
0032067  9/1979  Japan ................ 437/227
0073933  5/1982  Japan .
57-73933  5/1982  Japan .
0016442  1/1985  Japan ................ 437/227

OTHER PUBLICATIONS

"Improvement of D Level Auto-Align Target Through Redesign of B Level Mask", IBM Technical Disclosure Bulletin, vol. 28, No. 4, Sep. 1985, p. 1788.

*Primary Examiner*—Brian E. Hearn
*Assistant Examiner*—B. Everhart
*Attorney, Agent, or Firm*—Armstrong, Nikaido, Marmelstein, Kubovcik & Murray

[57] ABSTRACT

A method for preventing contamination caused by residues of etched off patterns etched by photolithographic etching. A considerable amount of small contamination spots on a semiconductor chip are found to be caused by tiny residues of etched off patterns. These residues are formed primarily around the periphery of device areas and mark patterns when their outsides are etched off. The occurence of such residues of etching is increased by anisotropic etching. These residues are dislodged by succeeding steps of the pattern making process, and disperse over the substrate causing small contamination spots. To avoid the detrimental effects of the etching residues, the edges of the mark patterns and device areas are covered with an edge cover which is formed in a step to following the pattern etching process.

7 Claims, 8 Drawing Sheets

FIG. 1(a)
PRIOR ART
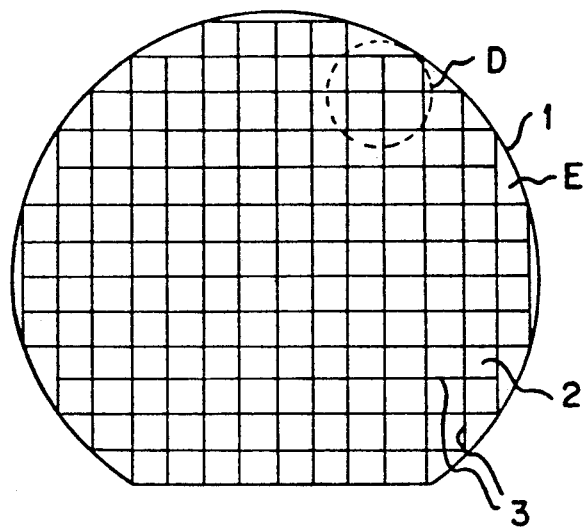
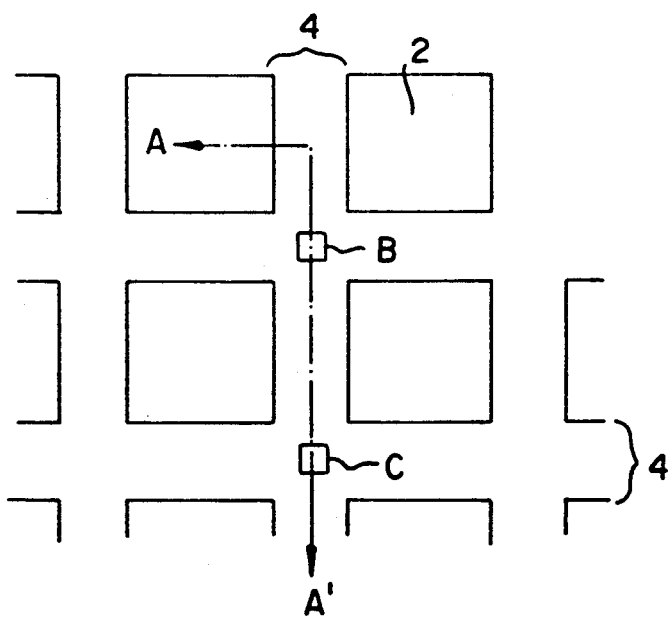
FIG. 1(b)
PRIOR ART

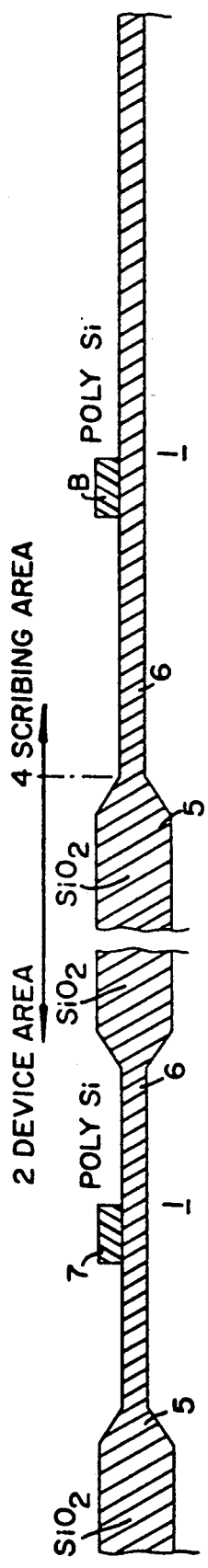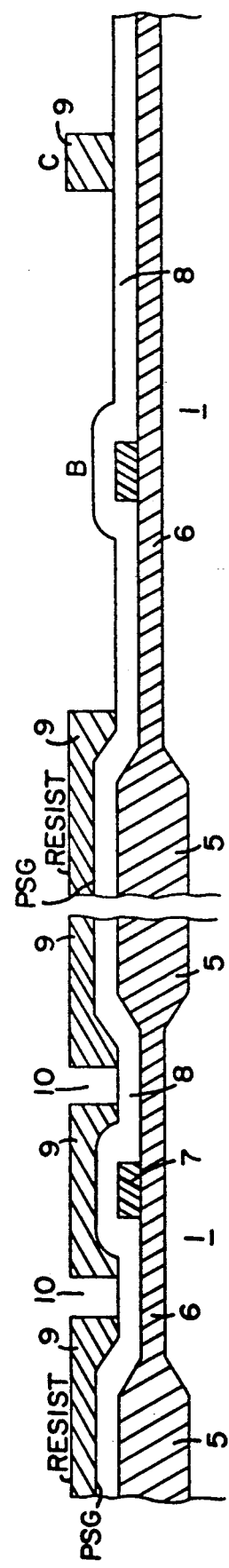
FIG. 2(a) PRIOR ART
FIG. 2(b) PRIOR ART

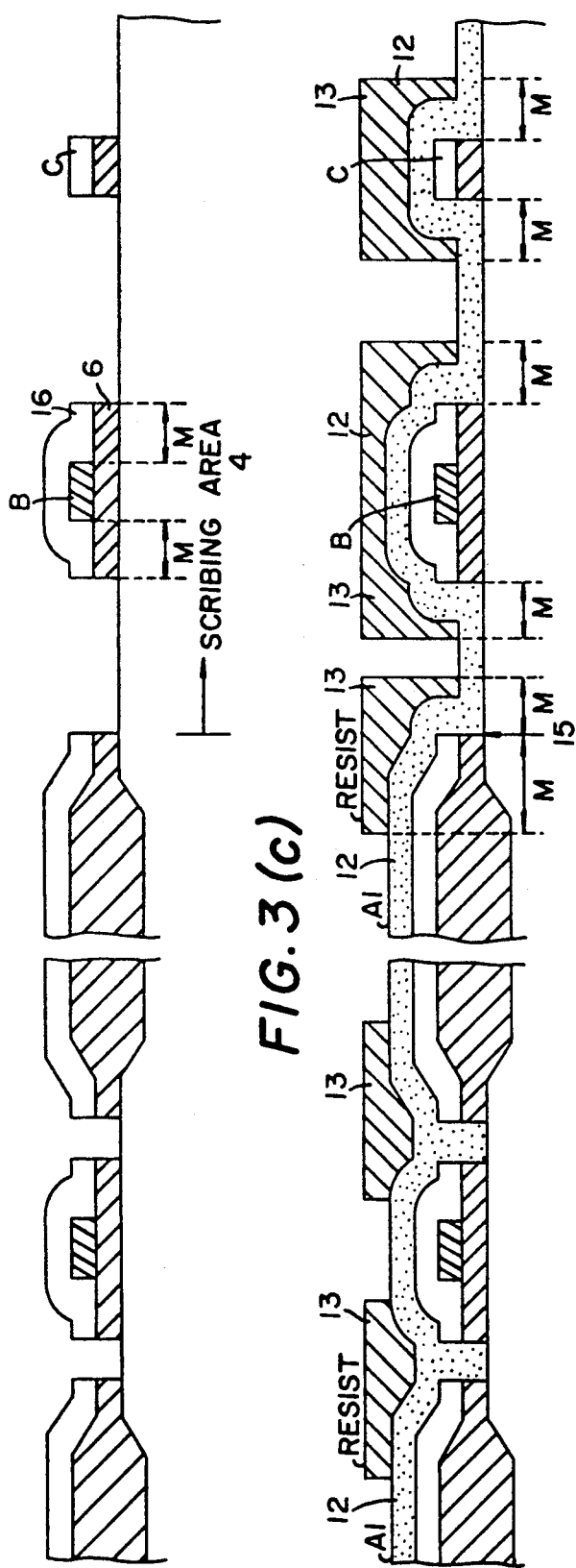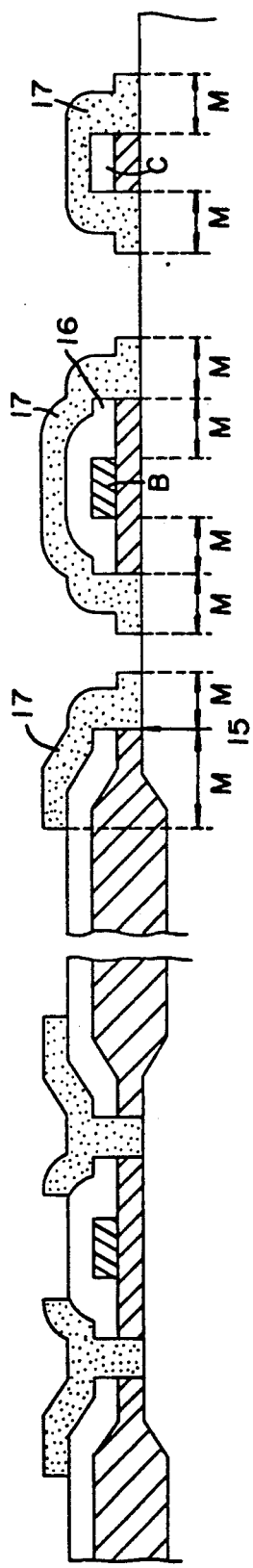
FIG.3(c) FIG.3(d) FIG.3(e)

METHOD FOR FABRICATING SEMICONDUCTOR DEVICES THAT PREVENTS PATTERN CONTAMINATION

BACKGROUND OF THE INVENTION

The present invention relates to a method for fabricating semiconductor devices. More particularly, the present invention relates to an improved method for forming chip patterns which prevents the devices from contamination caused by residues of removed patterns which are etched off by a photolithographic process.

One important factor which has a substantial effect on the production yield of semiconductor devices is contamination. Most of the semiconductor devices are fabricated in a clean room or on a laminar flow bench in which filtered air flows to remove dust floating in the air. As the integration rate in a semiconductor chip increases, the problem of dust rejection became more severe. Thus all of the integrated circuit (IC) chips are now fabricated in a super clean room.

The contamination rejection is performed thoroughly and as completely as possible in all of the production steps, equipment, materials, chemicals and water used in production. But production still often suffers from contamination, and the yield is thus affected. This trend is becoming severe, and thus can not be ignored in the production of large scale integration (LSI) circuits.

SUMMARY OF THE INVENTION

An object of the present invention, therefore, is to reduce the contamination in the production process of semiconductor devices.

Another object of the present invention is to provide a method which further reduces the contamination during the production process.

Still another object of the present invention is to further improve the production yield of semiconductor devices.

The precise investigation of various contaminations on semiconductor substrates has shown that there are a considerable number of contamination spots which appear to be broken pieces of removed portions of patterns which were etched off by a photolithographic process. The origins of these broken pieces are found to be at the periphery of device areas and mark patterns. The former defines the device area on the chip and the latter is used for various mask alignments or checking the chips. Around these patterns there are often found tiny residues of the removed parts of the pattern. These residues are dispersed over the substrate by a succeeding process and cause the contamination spots.

According to the present invention, the pattern edges of these device areas and mark patterns are covered with an edge cover. The edge cover is formed in a process step which comes after each pattern making process. The edge cover, therefore, is made of a material which covers the pattern in the step that follows each pattern making process. Using such an edge cover, the appearance of the residues in the etching process, and hence the contamination spots are prevented.

Other objects and advantages of the present invention will become apparent from the detailed description of preferred embodiments to follow taken in conjunction with the appended claims and accompanying drawings.

BRIEF DESCRIPTION OF THE DRAWINGS

FIG. 1(a) is a schematic plan view of a semiconductor substrate for ICs.

FIG. 1(b) shows a partially enlarged view of a portion of the substrate of FIG. 1(a).

FIGS. 2(a)-2(e) show schematically how the residues of the removed parts of the pattern are formed in a prior art photolithographic process, wherein:

FIG. 2(a) shows a state when a device pattern and a mark pattern are respectively formed by polysilicon on a device area and a scribing area of a substrate;

FIG. 2(b) shows a state when the substrate is coated with a phosphosilicate glass (PSG) film, with a photoresist film patterned over it;

FIG. 2(c) shows the state when the PSG film is patterned by etching, and at the same time another mark pattern is formed on the scribing area, and also shows how a residue of PSG appears at the periphery of the marking pattern;

FIG. 2(d) shows the state when an aluminum film is deposited over the substrate, and a photoresist pattern is formed for the aluminum wiring; and FIG. 2(e) shows the state, when the aluminum film is etched off leaving a wiring pattern, and shows how aluminum residues remain around the periphery of the device areas.

FIGS. 3(a)-3(e) show schematically, how the edge covers are formed by the present invention to prevent the dispersion of the residues of the etched off patterns, wherein:

FIG. 3(a) shows the state when a polysilicon device pattern and a mark pattern are respectively formed on a device area and a scribing area of a substrate;

FIG. 3(b) shows the state when the substrate is covered with a PSG film, with a photoresist film patterned over it;

FIG. 3(c) shows the state when the PSG film is patterned by etching, and another mark pattern of PSG is formed on the scribing area, illustrating how an edge cover is formed by the PSG film over the mark pattern;

FIG. 3(d) shows the state when the substrate is coated by an aluminum film, and a photoresist over it has been patterned for aluminum wirings; and FIG. 3(e) shows the state when the aluminum film is etched off to form the wiring, and at the same time second edge covers are formed by the aluminum film at the edge of the device area and around the mark patterns.

FIGS. 5(a)-5(b) show an example of another mark pattern which is not covered entirely by the edge cover, wherein:

FIG. 5(a) is a cross sectional view thereof; and

FIG. 5(b) is a plan view of the mark pattern.

Throughout the drawings, same reference characters and numerals designate the same or corresponding parts.

DESCRIPTION OF PREFERRED EMBODIMENTS

Figure 2C:
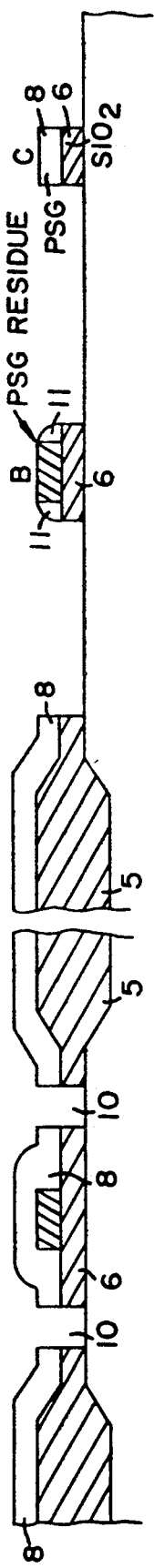

As has been described before, the production yield of semiconductor devices largely depends on the contamination during the manufacturing process. Even though the production is carried out in a super clean room, and the materials used, such as water and chemicals, are carefully checked for the absence of contamination, the substrate often suffers from contamination spots. The occurrence of trouble caused by contamination spots increases as the chip size of the IC becomes larger, and the circuit design becomes fine, because only one contamination spot on the chip causes damage to the total circuit.

The inventors have carefully investigated the contamination spots at various stages of the production process, and noticed that a considerable portion of the contamination spots are caused by tiny broken pieces of removed portions of the patterns. Further investigation has shown that such broken pieces are often left around the periphery of the device area and around various mark patterns when these patterns are formed by a photolithographic etching process.

FIG. 1(a) shows a plan view of a substrate for ICs. It is sometimes called a wafer because of its shape. A plurality of device areas 2 are arranged in a grid form on the substrate 1. In each of these device areas, the IC circuit (not shown) is formed, and when these device areas 2 are separated from each other by cutting the substrate 1 along cutting lines 3, the IC chips are completed.

A portion of the substrate 1 encircled by a broken line D is shown enlarged in FIG. 1(b). There are scribing areas 4 running straight in both horizontal and vertical directions, between the device areas 2. In FIG. 1(b), the scribing areas 4 are shown especially enlarged compared to the device area 2, for the purpose of explanation. The cutting line 3 (not shown) runs in these scribing areas.

The scribing areas 4 have small mark patterns B and C, which are used as marks for various mask alignments or for various inspection instruments. These mark patterns may also be formed in a marginal space E of the substrate 1. But since many marks are necessary for various manufacturing processes and checking processes of the substrate, such mark patterns are usually formed in the scribing areas 4. After the production and inspection processes are finished, most of these mark patterns are lost by scribing the substrate along the cutting line 3.

Though the mark patterns are shown as squares in the drawings, their shape may be circular, triangular, cross shaped or any other shape, and their size also may be varied depending on the purpose and equipment which uses the mark patterns. Similarly, the shape, size and materials of any part of the device in the disclosures to follow are given as an explanatory purpose and not restrictive. So the spirit and scope of the present invention are not restricted to those embodiments described below.

The residues of the etched off portion of the pattern are found around the periphery of the device area 2 or around the mark patterns B or C in FIG. 1(b). First, how these residues are formed will be explained briefly referring to an exemplary photolithographic etching process which is used widely for manufacturing semiconductor devices.

FIGS. 2(a)-2(e) are cross sections of a semiconductor substrate cut along a broken chained line AA' in FIG. 1(a), showing some of the major steps for forming various patterns. The device area 2 is large, a few mm² for example, compared to the scribing area which is about 100 μm in width. An IC circuit is formed on the device area 2. In FIGS. 2(a)-2(e), only the edge portion of the device area 2 is shown.

FIG. 2(a) shows a state when the surface of the substrate 1 is covered with silicon dioxide layers 5 and 6 having different thicknesses. The thicker silicon dioxide layer 5 may be a field oxide layer, and the thinner layer 6 may be a gate oxide layer, for example, and the respective thicknesses may be 0.5 μm and 500 Å for example. An electrode 7, which might be a gate electrode for example, and a mark pattern B (called first mark pattern hereinafter) are respectively formed on the device area 2 and the scribing area 4. These oxide layers are formed by conventional semiconductor technology such a oxidation and photolithography. The electrode 7 and the first mark pattern B are made from polysilicon for example. The technology and materials for the above described device are all conventional and therefore, further explanation will be omitted for the sake of simplicity.

FIG. 2(b) shows a state when the surface of the substrate is coated with a phosphosilicate glass (PSG) layer 8 of about 1 μm thickness for example, and coated with a photoresist film 9. The photoresist film 9 is patterned for contact holes 10, for example, and the major portion of the scribing area 4 is exposed leaving a portion for making a new mark pattern C (called second mark pattern hereinafter). In this step, the first mark pattern B is used for aligning a photo mask for the contact holes 10. Thus, the contact holes 10 and the electrode 7, for example, are aligned with each other. Leaving these patterns, the photoresist film 9 is removed.

FIG. 2(c) shows a state when the PSG layer 8 and the silicon dioxide layer 6 which are exposed from the photoresist when film 9 has been etched off to open the contact holes 10, and the photoresist film has been removed. At this stage, the second mark pattern C is formed by PSG. The etching method used in this stage may be of any kind such as chemical etching or dry etching including plasma reactive etching. It should be noted that a residue 11 of PSG remains around the first mark pattern B. On the other hand, the residue does not appear at the openings 10 or at the edge of the device area 2.

This is explained as follows, turning back to FIG. 2(b), the etching proceeds from the surface of the PSG layer 8 toward the thickness direction of the PSG layer. When the etching front reaches the bottom of the PSG layer 8, the silicon dioxide layer 6 and the top of the polysilicon mark pattern B appears. In order to avoid an over etching, the etching process is stopped at this point. The etchant is then switched to the chemical for etching the silicon dioxide layer 6. But as seen in the figure, the thickness of the PSG layer 8 is thick around the mark pattern B so the residue 11 of the PSG remains. Such residues are more likely to be enhanced when an anisotropic etching process is used rather than when an isotropic etching is used, because an anisotropic etchant etches mainly in the vertical direction, while an isotropic etchant etches the layer both in the vertical and horizontal directions.

Figure 2D:
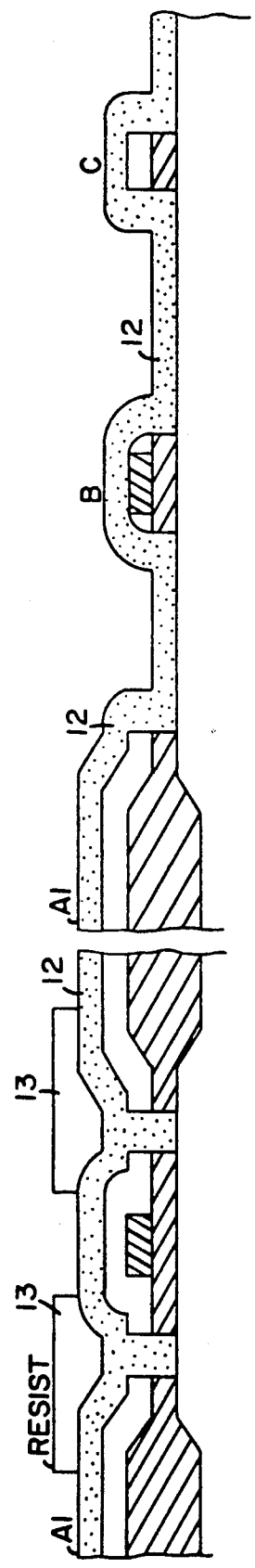

FIG. 2(d) shows a state when an aluminum layer 12 of about 1 μm thickness for example, is formed over the substrate, and a photoresist film 13 is formed over the aluminum layer 12 for wiring. FIG. 2(d) shows a state after the photoresist film 13 has been removed leaving the wiring pattern. In this step, the alignment of the mask for the wiring pattern is done using the second mark pattern C for example.

Figure 2E:
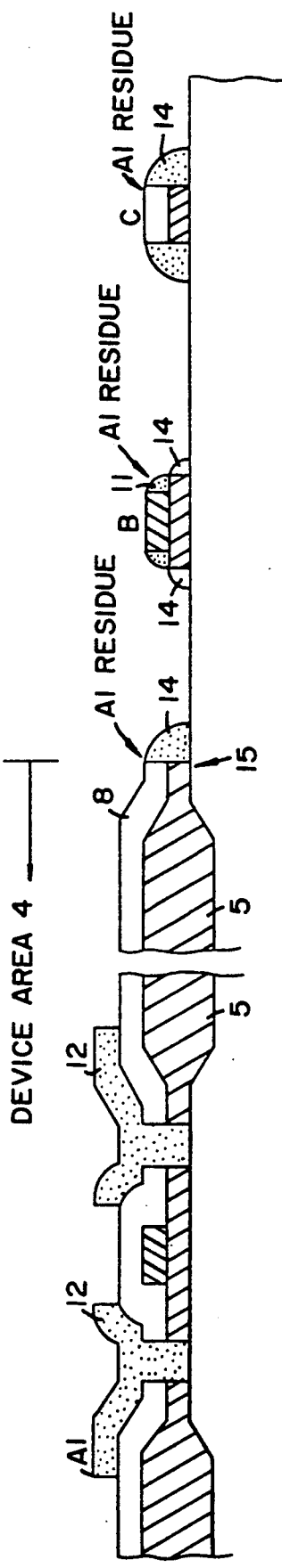

FIG. 2(e) shows a state when the aluminum layer 12 is etched off leaving the wiring pattern, and the photoresist film 13 has been removed. Here again residue 14 of the aluminum layer is present. It should be noted that in this stage, the residue 14 of the aluminum layer appears not only around the mark patterns B and C, but also at the edge of the device area 2. The reason for this residue is similar to those of the PSG residue described above. The vertical line 15 in FIG. 2(e) indicates the edge of the device area 2, that is the edge of the chip pattern. Since the device area is much larger than the mark patterns, the chance of the residue is higher than that around the mark patterns.

In the above description, the appearance of the residues was explained referring to the patterning process of the PSG and aluminum layers. But in practice, various kinds of materials are used for various patterns, therefore, it will be apparent that various kinds of residues may appear in various etching processes.

Such residues should be removed completely. But it is very difficult to etch them off perfectly. Further, the anisotropic characteristics of the etching enhances the occurrence of such residues. However, such residues are very tiny ones, less than 1 μm in size, and easily overlooked. If the etching is done too strong to remove these residues, over etching occurs. But recently the pattern on the devices have become very fine, and accordingly, the control of the etching is very critical, and over etching is undesirable. The unetched residues 11 and 14 are separated from the substrate by various processes which follow, and they are dispersed all over the surface of the substrate producing contamination spots.

Figure 3A:
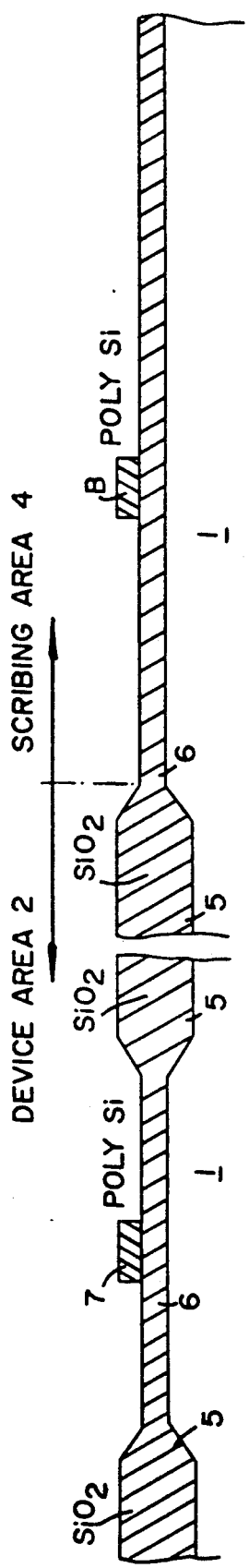

Now, the way in which the detrimental effects caused by the residues of these removed patterns can be prevented by the present invention will be explained referring to the embodiment of FIGS. 3(a)-3(e), which corresponds to the case of FIGS. 2(a)-2(e). FIG. 3(a) shows a state when the gate electrode and a first mark pattern B are formed by polysilicon on the gate oxide layer 6. The gate electrode 7 and the gate oxide layer 6 are parts of a device formed at an edge portion of the device area 2. There may also be other parts of the circuit formed in the device area 2. In this embodiment, the electrode 7 and the first mark pattern B are both made of polysilicon. These elements may also be formed with other materials.

Figure 3B:
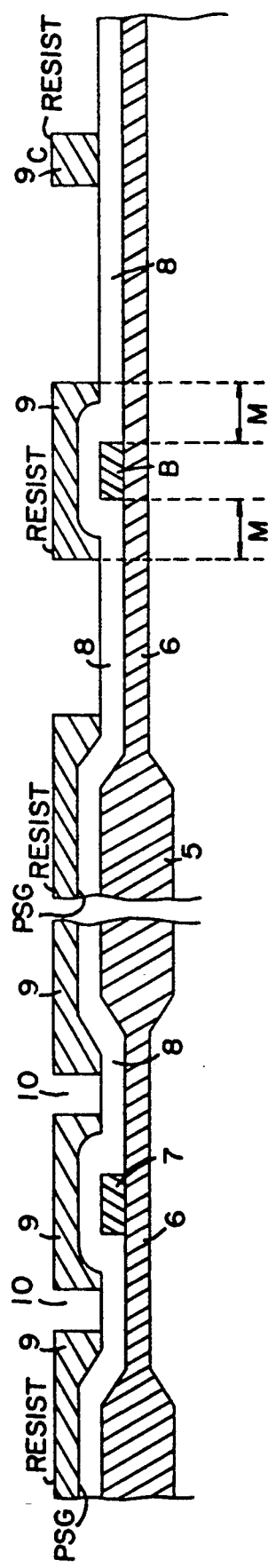

FIG. 3(b) shows a state in which a PSG layer 8 is deposited over the substrate, and a photoresist film 9 over the layer 8, is patterned to expose a portion for the contact holes 10 and most of the scribing area 4. Compared to FIG. 2(b), the photoresist film 9 is not completely removed from the scribing area 4. The photoresist film 9 remains over the first mark pattern B. Of course, the photoresist film 9 also remains at the position of the second mark pattern C. Further, it should be noted that the photoresist film over the first mark pattern B is larger than the first mark pattern B, so the photoresist film extends around the first mark pattern B by an amount M, where M is a margin. The size of the margin M is not critical, it may be large unless it becomes too large and overlaps neighboring patterns. The margin M may be from 1 to 10 μm, for example.

When the PSG layer 8 and the silicon dioxide layer 6 are etched off, and the photoresist film 9 is removed, the substrate becomes as shown in FIG. 3(c). Compared to FIG. 2(c), the PSG layer 8 intentionally covers the first mark pattern B. In FIG. 3(c) there is no residue, but there is an edge cover 16. The edge cover 16 (called the first edge cover hereinafter) extends outwardly on both sides of the first mark pattern B by a margin M. The contact area between the edge cover 16 and the gate oxide layer 6 is much larger than that of the residue of PSG 11 of FIG. 2(c). Therefore, the edge cover 16 tightly adheres to the gate oxide layer 6, and to the first mark pattern B. The edge cover is never separated by succeeding process steps, and therefore, never makes any contamination spots.

FIG. 3(d) illustrates a state, when an aluminum layer 12 is formed over the substrate, and a photoresist film 13 is applied to it, and is patterned. Compared to FIG. 2(d), the photoresist film 13 is not completely removed from the scribing area 4, but the margin M remains on the outside of the mark patterns B and C. It should be noted that at this stage, the photoresist 13 is also left on both sides of the edge 15 of the device area 2, with a margin space M. The size of the margins M is not necessarily equal. As has been described above, the size of these margins M may be large unless they overlap with neighboring patterns, and the margin M may be from 1 to 10 μm, for example.

When the aluminum layer 12 is etched off by reactive ion etching (RIE) using boron chloride (BC13) as an etchant gas for example, and the photoresist is removed, the substrate becomes as shown in FIG. 3(e). Compared to FIG. 2(e), the aluminum film 12 is intentionally left over and around the mark patterns B, C and on both sides of the edge 15 of the device area with margins M. This intentionally left aluminum layer becomes a second edge cover 17. Of course, the size of the margins M are not necessarily be equal to each other. The effect of these second edge covers 17 are similar to that of the first edge cover 16. Therefore, no residues of the etched off pattern appears, and thus the contamination spots caused by the residues are completely prevented.

In the above disclosure, all edges of the device area and mark patterns are covered with respective edge covers. In the present embodiment, these edge covers are made from aluminum, or PSG, because they are formed by etching respectively the aluminum layer or PSG layer. It will be apparent to one skilled in the art that the material of these edge covers depends on the material used in the manufacturing process of the semiconductor device. Therefore, the material of the edge cover may be a metal or an insulator. Further, if there are third and fourth mark patterns, their edges will also be covered with respective edge covers. It will be understood that, each time a mark pattern is formed, the edges of the mark pattern and the device area are covered with respective edge covers which are formed in a later step which comes after the pattern making, and the material for making the edge cover is one of the materials used in the later step.

In the above disclosure of the first embodiment of FIGS. 3(a)-3(e), the mark pattern B is formed with a first layer, polysilicon for example, and coated by a second layer, PSG layer 8 for example (see FIG. 3(c)). Occasionally there are cases when the mark pattern B, for example, can not be covered with a second layer, the PSG layer for example. Such a case often occurs as a result of a design requirement for the device, or the choice of machine or material is restricted. For example, in FIG. 3(b), if it is necessary to use a positive photoresist as a resist film 9, the resist over the mark pattern B can not remain. Because in the mask alignment step using the mark pattern B, the mark pattern B is exposed, and the resist over the mark pattern B is washed off in the development process. Thus, an edge cover can not be formed over the mark pattern B.

The second embodiment of the present invention is designed to overcome this problem. FIGS. 4(a), 4(b), 4(c) and 4(d) show the major steps of the second embodiment respectively corresponding to the steps of the first embodiment of FIGS. 3(b)-3(e).

Figure 4A:
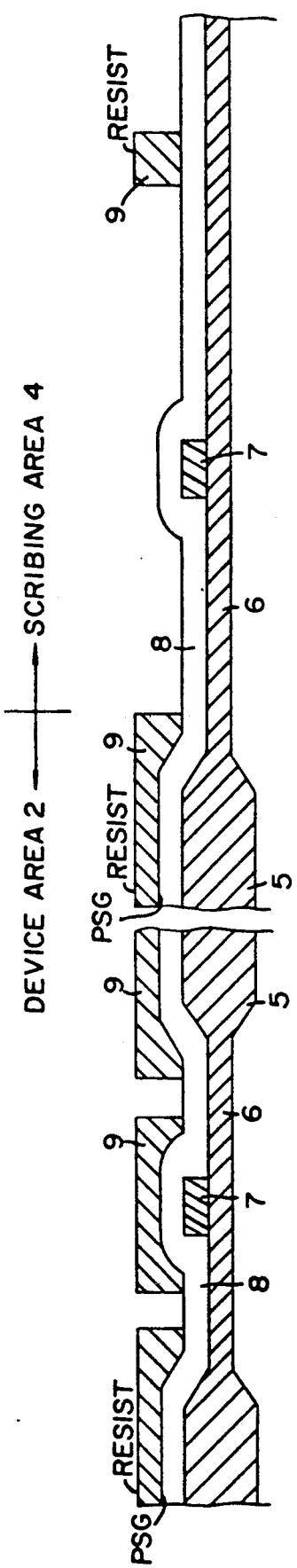
FIGS. 4(a)-4(d) show another embodiment of the present invention in which the PSG film does not cover the polysilicon layer due to some design or material limitations, wherein FIGS. 4(a), 4(b), 4(c) and 4(d) respectively show the stages corresponding to the stages 3(b), 3(c), 3(d) and 3(e) of the previous embodiment.

FIG. 4(a) illustrates a state corresponding to FIG. 3(b). The electrode 7 and the first mark pattern B are formed by a first layer of polysilicon formed over the silicon dioxide layer 6. The second layer, PSG layer 8 for example, is formed over the substrate covering the electrode 7 and the first mark pattern B, and a photoresist film 9 is applied and patterned. In this second embodiment, as shown in FIG. 4(a), the photoresist film 9 does not cover the first mark pattern B, though it covers the second mark pattern C, because the mark pattern B is exposed while the photo mask is aligned with the mark pattern B. Such a case may occur when a positive type mask is used, for example. Thus, the photoresist over the mark pattern B is washed off when it is developed.

Figure 4B:
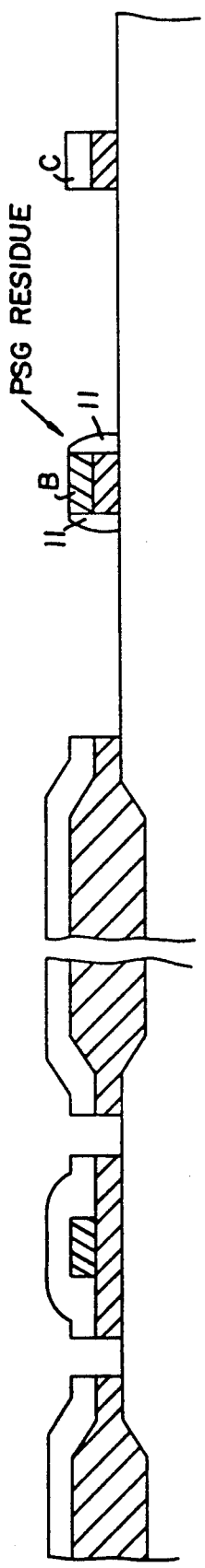

Thus, as shown in FIG. 4(b), when the PSG layer 8 and the silicon dioxide layer 6 are etched off, the residues 11 may remain around the first mark pattern B. This is similar to the case of FIG. 2(c).

Figure 4C:
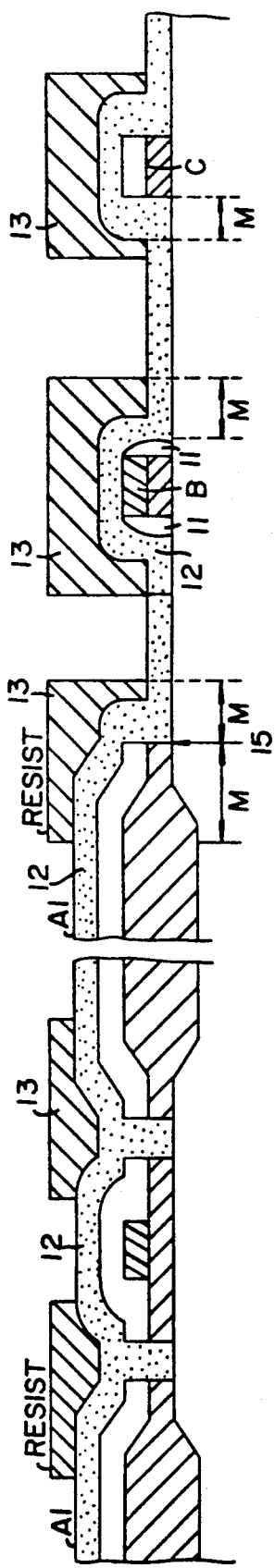

But in the next stage of FIG. 4(c), the mark pattern B and the residue 11 are completely covered by the aluminum layer 12. The photoresist film 13 is then patterned to form an edge cover over the mark pattern B and C and the edge 15 of the device area. Of course, proper margins M are left on both sides.

Figure 4D:
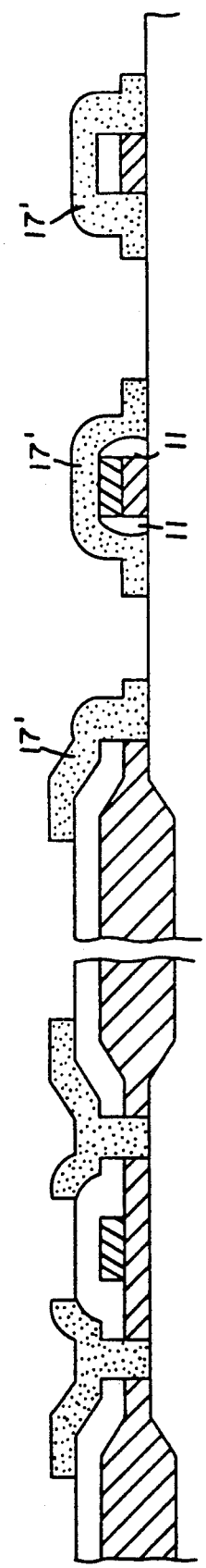

When the aluminum layer is etched off and the photoresist film is removed, the substrate becomes as shown in FIG. 4(d). As can be seen, the edge covers 17' are formed which cover all of the edges of the patterns. Therefore, the contamination by the residue of the removed pattern is prevented.

As can be seen in the above second embodiment, the mark pattern B is made by the first layer of polysilicon. Though the second layer of PSG has been washed off, the mark pattern B is covered by the third layer, the aluminum layer for example. It will be apparent to one skilled in the art that each of the mark pattern edges is covered by a respective edge cover which is made from a layer covering the mark pattern in one of the steps which comes after the pattern making step, so the edge cover is made from one of the materials used in the later step. In a practical fabrication process of ICs, there are many steps which form a layer over the substrate. Among them there are preferable steps which use a desirable material for fabricating the edge covers. Thus, it is easy to chose proper steps for making the edge covers without adding any special steps to form the edge covers.

Figure 5:
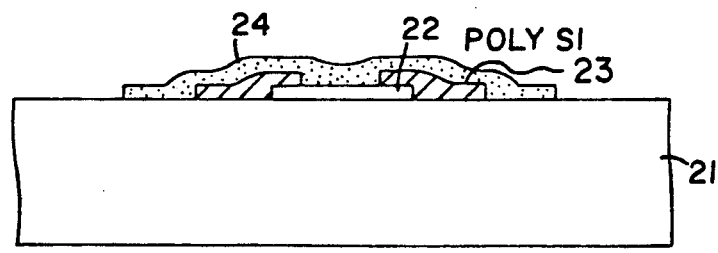
Figure 5B:
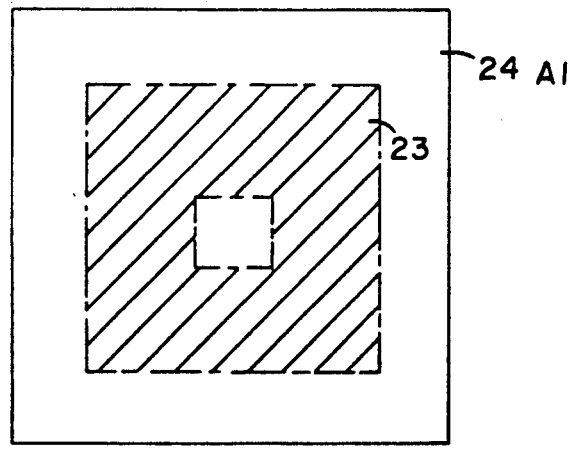

In all of the above embodiments, the mark patterns were considered to be covered completely by the edge covers. But it is not always necessary to cover the entire part of the mark pattern. FIGS. 5(a)-5(b) show an example when the mark pattern is not covered entirely by an edge cover. FIG. 5(a) is a cross section, and FIG. 5(b) is a plan view of such a mark pattern.

In FIGS. 5(a)-5(b), the mark pattern 22 is formed on a substrate 21, the mark pattern 22 is formed by polysilicon for example. In this example, the first edge cover 23 is made from silicon dioxide ($SiO_2$, because, the second layer which covers the pattern 22 was a $SiO_2$ layer). The edge cover 23 does not cover the entire mark pattern 22, and the mark pattern 22 is exposed in its center portion. Further in this embodiment, the mark pattern is covered with aluminum layer 24, which is patterned to form a second edge cover. The process for fabricating such a pattern will be readily apparent to one skilled in the art by analogy with the foregoing two embodiments. So, further description is omitted for the sake of simplicity.

Further it will be apparent, that the second edge cover covers the first edge cover which is formed prior to the second edge cover. In a like manner, each edge cover is covered by succeeding edge covers which are formed in the later steps for covering other pattern edges.

Applying the production process of the present invention as disclosed above, contamination spots which often appeared in semiconductor production process have been eliminated, and the yield of the IC production has been increased and stabilized.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

We claim:

1. A method for fabricating semiconductor devices comprising the steps of:
    a first step of forming a plurality of device areas having semiconductor devices formed therein and a scribing area separating each of said device areas from one another, wherein said device areas and said scribing area are formed on a semiconductor substrate;
    a second step of forming at least one of a plurality of mark patterns in said scribing area; and
    a third step, following said second step, of forming an edge cover on at least one of said plurality of mark patterns and said device patterns, such that each edge cover covers at least the peripheral portion of the mark pattern or device pattern and extends towards said scribing area beyond the edge of said mark pattern or device pattern, and contacts said substrate.

2. A method for fabricating semiconductor devices according to claim 1, wherein said second and third steps are repeated until all said mark patterns and said device patterns are provided with said edge covers.

3. A method for fabricating semiconductor devices according to claim 1 or 2, wherein:
    said second step comprises,
        a first substep of forming a first layer over said substrate,
        a second substep of forming at least one of said first mark patterns by patterning said first layer; and wherein
    said third step comprises,
        a third substep of forming a second layer over said substrate, and
        a fourth substep of forming said edge cover for at least one of said first mark patterns or device patterns, by patterning said second layer.

4. A method for fabricating semiconductor devices according to claim 3, wherein the substeps of said second and third steps are common with corresponding steps for forming said device areas.

5. A method for fabricating semiconductor devices according to claim 1, wherein said third step includes forming each of said edge covers so that the cover extends a distance of 1 to 10 μm on both sides of the edge of the mark patterns or device areas.

6. A method for fabricating semiconductor devices according to claim 1, wherein said edge cover is patterned by an anisotropic etching process.

7. A method for fabricating semiconductor devices comprising the steps of:

providing a semiconductor substrate having a plurality of device areas separated by a scribing area, each of the device areas having a step at an edge thereof;

forming a film on the device areas and the scribing areas; and patterning said film by anisotropic etching to form a portion of semiconductor devices, said film being etched such that said film remains on the step of said device area and extends towards the device areas and the scribing area wherein a distance of extension on both sides exceeds a minimum distance required to prevent said film from being peeled off the step.

* * * * *